(12) United States Patent
Lo et al.

(10) Patent No.: US 6,228,753 B1
(45) Date of Patent: May 8, 2001

(54) METHOD OF FABRICATING A BONDING PAD STRUCTURE FOR IMPROVING THE BONDING PAD SURFACE QUALITY

(75) Inventors: Yung-Tsun Lo, Hsinchu Hsien; Wen-Yu Ho, Hsinchu; Sung-Chun Hsieh, Taipei, all of (TW)

(73) Assignee: Worldwide Semiconductor Mfg Corp, Hsinchu (TW)

( * ) Notice: Subject to any disclaimer, the term of this patent is extended or adjusted under 35 U.S.C. 154(b) by 0 days.

(21) Appl. No.: 09/336,044

(22) Filed: Jun. 18, 1999

(30) Foreign Application Priority Data

May 4, 1999 (TW) .................................................. 88107214

(51) Int. Cl.$^7$ .................................................... H01L 21/44
(52) U.S. Cl. .......................... 438/612; 438/106; 438/613
(58) Field of Search .................................... 438/106, 612, 438/613

(56) References Cited

U.S. PATENT DOCUMENTS 5,612,254 * 3/1997 Mu et al. .
5,930,664 * 7/1999 Hsu et al. .

* cited by examiner

Primary Examiner—Kevin M. Picardat
Assistant Examiner—D. M Collins
(74) Attorney, Agent, or Firm—Jiawei Huang; J C Patents

(57) ABSTRACT

A method of fabricating bonding pad structure for improving bonding pad surface quality. A substrate has a bonding pad thereon. A passivation is formed on the bonding pad to expose the bonding pad. A sacrificial layer is formed on the passivation and an opening is formed within the sacrificial layer to expose the bonding pad. A Cu/Al alloy is formed on the passivation to at least cover the bonding pad. The sacrificial layer and the Cu/Al alloy thereon are removed, such that the Cu/Al alloy remains on the bonding pad.

19 Claims, 2 Drawing Sheets

METHOD OF FABRICATING A BONDING PAD STRUCTURE FOR IMPROVING THE BONDING PAD SURFACE QUALITY

CROSS-REFERENCE TO RELATED APPLICATION

This application claims the priority benefit of Taiwan application serial no. 88107214, filed May 4, 1999, the full disclosure of which is incorporated herein by reference.

BACKGROUND OF THE INVENTION

1. Field of Invention

The present invention relates to a method of fabricating a bonding pad for a semiconductor. More particularly, the present invention relates to a method for improving bonding pad surface quality.

2. Description of Related Art

In the manufacturing process of the bonding pad for an integrated circuit, the passivation layer over the wafer is patterned and then the bonding pad is exposed by forming an opening within the passivation layer. Thereafter, an alloy thermal process is performed to enhance the adhesion between the aluminum copper alloy on the surface of the bonding pad and the metal underlying thereof. Since the thermal expansion coefficient of the aluminum copper alloy is large, hillocks are created on the aluminum copper alloy by thermal stress in the metallic material due to the thermal alloying process. After the etching process for forming the opening in the passivation layer, a cleaning step performed in acid tank is required in order to remove residue on the wafer. However, the aluminum copper alloy is easily corroded by the acid solution to cause damage thereon. A polyimide is then coated over the wafer. When photolithography for the polyimide is carried out, the grain boundary of the aluminum copper alloy is attacked by the developer, leading to cracks. In addition, the aluminum copper alloy is subject to $Al_2Cu$ phase formation, which easily reacts with the aluminum in the aluminum copper alloy to cause a galvanic reaction and accordingly, $Al^{3+}$ is generated and leads to erosion.

Therefore, the appearance of the aluminum copper alloy on the surface of the bonding pad is seriously degraded when the alloying, cleaning and development processes are complete. However, the bonding pad is the only structure exposed by the passivation layer, and thus the appearance of the bonding pad is the only quality which the clients is capable of checking. As a result, the clients will reject the product due to the bad appearance of the bonding pad, even though no problems manifest during the wafer acceptance test (WAT). As a result, the producer who makes the bonding pad has to discard the wafers and loses substantial amounts of money.

SUMMARY OF THE INVENTION

The invention provides a method for improving bonding pad surface quality. A bonding pad is disposed on a substrate. A passivation is formed on the substrate to expose a portion of the bonding pad. A photoresist layer is then formed over the substrate. Photolithography is performed on the photoresist layer to form an opening within the photoresist layer, such that the bonding pad is exposed. Thereafter, an alloy layer is formed on the bonding pad and the photoresist layer is removed.

In one embodiment of the invention, after the opening is formed to expose the bonding pad, an alloy layer is formed over the bonding pad and the photoresist layer. Since there is no baking when forming the photoresist layer, the photoresist with no curing has poor adhesion with the passivation. Therefore, the photoresist layer can be removed by supersonic vibration and therefore the alloy layer adhered on the photoresist layer can simultaneously be removed.

As embodied and broadly described herein, the invention provides a method for improving bonding pad surface quality. Since the alloy layer is formed after the manufacture of the bonding pad structure and there is no additional process before the WAT, the appearance of the bonding pad remains smooth. Therefore, the wafers appear to be high quality wafers and can be easily sold. Additionally, the fabricating cost is reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
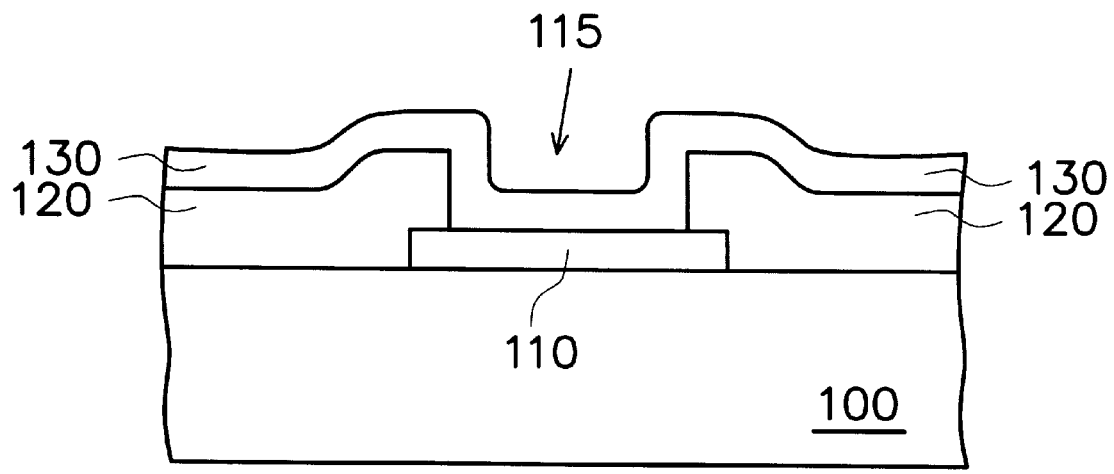
FIGS. 1A–1D are schematic, cross-sectional views illustrating fabrication of a bonding pad according to the preferred embodiment of this invention.

Referring to FIG. 1A, a bonding pad 110 is formed on a substrate 100. A passivation 120 is formed over the substrate 100 to expose a portion of the bonding pad 110. The passivation 120 can be composed of a BPSG and a silicon nitride, for example, and a polyimide (not shown) can be additionally formed on the passivation 120.

Figure 1B:
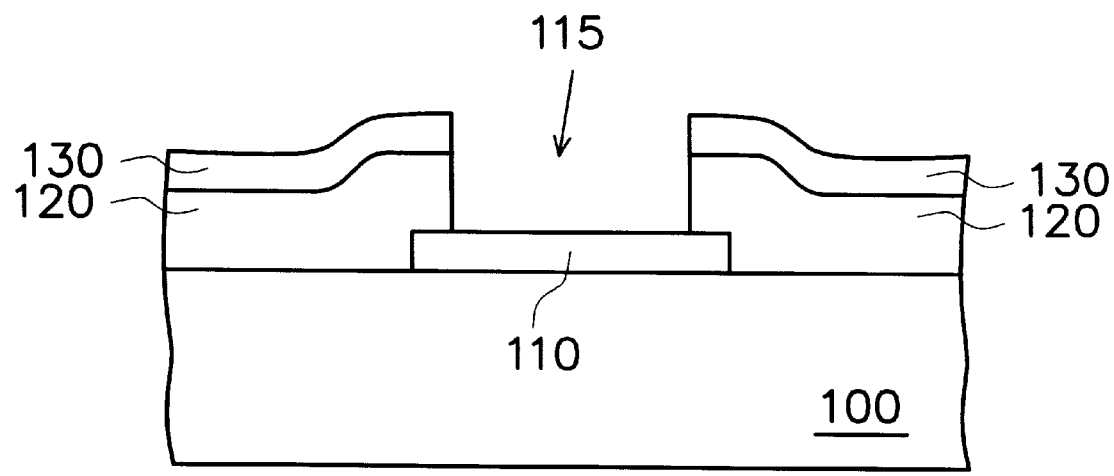

As shown in FIG. 1A, a sacrificial layer 130 such as a positive photoresist layer with a thickness of about 3000–5000 angstroms is then formed on the passivation 120. By using photolithography, after exposure, development and etching but without curing, the positive photoresist layer 130 is patterned to form an opening 115, as illustrated in FIG. 1B. The positive photoresist layer 130 above the bonding pad 110 is removed, and, as a result, the bonding pad 110 is exposed.

Figure 1C:
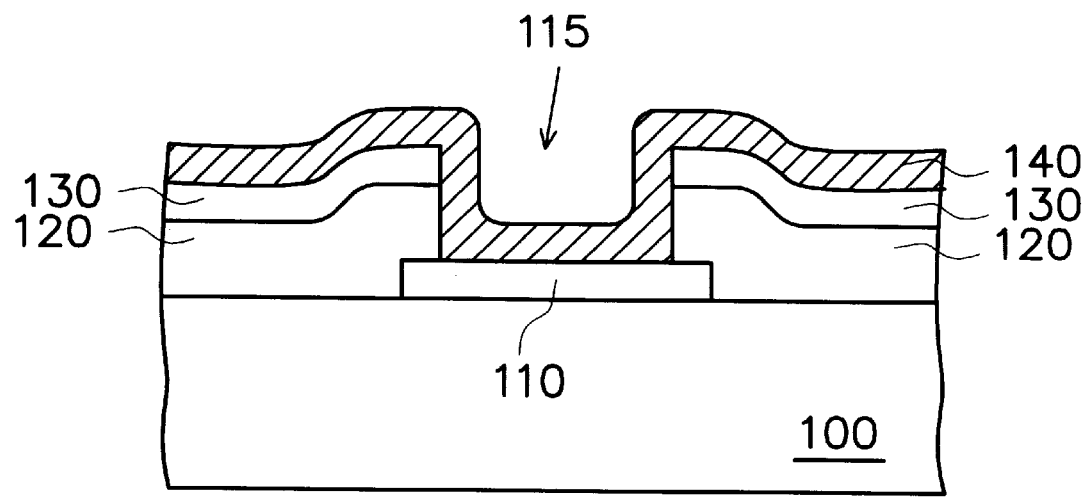

Referring to FIG. 1C, an alloy layer 140 is formed over the substrate 100 to cover the sacrificial layer 130 and the exposed bonding pad 110. The alloy layer 140 made of Al/Cu alloy can be formed by evaporation or an E-beam, for example, and the thickness of the alloy layer 140 is in the range of about 3000–6000 angstroms.

Figure 1D:
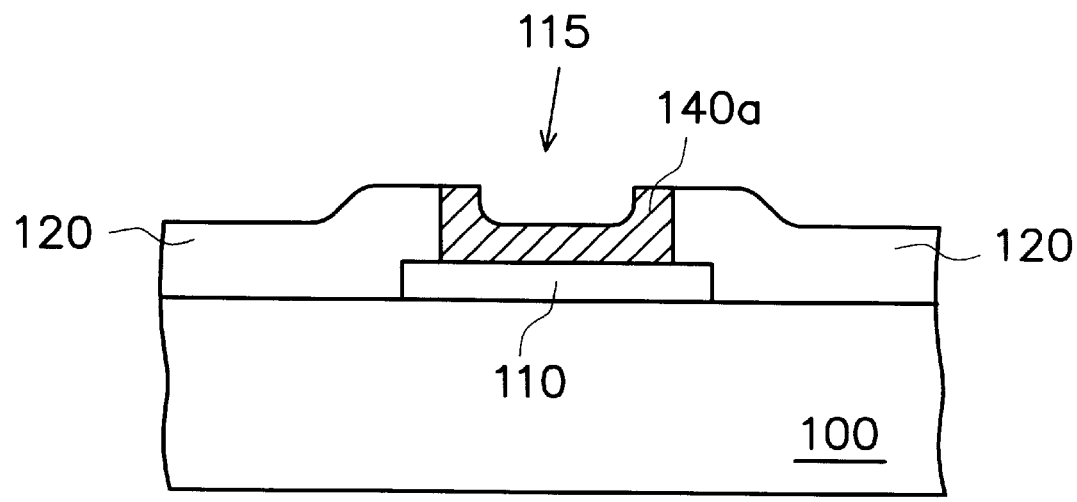

Referring to FIG. 1D, the sacrificial layer 130 and the alloy layer 140 thereon are then removed; that is, only the alloy layer 140a on the bonding pad 110 remains. For example, when the sacrificial layer 130 is made of a positive photoresist layer, the sacrificial layer 130 and the alloy layer 140 above the positive photoresist layer 130 can be removed by a supersonic cleaner, in which providessupersonic vibration in deionized water (DI). Since the positive photoresist layer is not baked and then no curing, it is still soft and loosely adhered on the passivation 120, such that the photoresist layer 130 is easily removed from the passivation 120. Accordingly, the alloy layer 140 on the positive photoresist layer 130 can be simultaneously removed when removing the positive photoresist layer 130 by the supersonic cleaner. On the other hand, there is no positive photoresist layer existed between the bonding pad 110 and the alloy layer, so that the alloy layer 140 does not be removed due to poor adhesion when the supersonic vibration is carrier out. Because the alloy layer 140a is left on the bonding pad 110 and there are no additional processes after removing the sacrificial layer 130, the appearance of the bonding pad 110 is therefore enhanced due to the formation of the alloy layer 140a.

The alloy is sputtered on the exposed bonding pad after the bonding pad structure is complete, such that the appearance of the bonding pad is enhanced. As a result, when the bonding pad is tested by WAT and shown to have no problems, the product can be sold to the clients and the manufacturing cost is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a bonding pad structure for improving bonding pad surface quality comprising:

forming a photoresist layer over the substrate, without baking, to loosely adhere on the passivation layer and the exposed bonding pad;

exposing a portion of the bonding pad by forming an opening within the photoresist layer;

forming an alloy layer over the photoresist layer and the exposed bonding pad; and using vibration to remove the photoresist layer and consequently removing a portion of the alloy layer on the photoresist layer, such that the alloy layer on the bonding pad remains.

2. The method according to claim 1, wherein a thickness of the photoresist layer is in the range of about 3000–5000 angstroms.

3. The method according to claim 1, wherein a method of forming the alloy layer includes evaporation.

4. The method according to claim 1, wherein a method of forming the alloy layer includes E-beam.

5. The method according to claim 1, wherein the alloy layer is in about 3000–6000 angstroms thick.

6. The method according to claim 1, wherein the alloy layer is made of Al/Cu alloy.

7. The method according to claim 1, wherein the step of using vibration to remove the photoresist layer is performed by a supersonic cleaner that uses supersonic vibration in deionized water.

8. The method according to claim 1, wherein the photoresist layer is not cured.

9. A method of fabricating bonding pad structure for improving bonding pad surface quality comprising;

providing a substrate with a bonding pad located thereon and a passivation layer disposed on the bonding pad such that a portion of the bonding pad is exposed;

forming a sacrificial layer over the substrate;

forming an opening within the photoresist layer to expose a portion of the bonding pad;

forming an alloy layer over the substrate; and removing the sacrificial layer to simultaneously remove a portion of the alloy layer on the sacrificial layer, such that the alloy layer on the bonding pad remains.

10. The method according to claim 2, wherein a method of forming the alloy layer includes evaporation.

11. The method according to claim 9, wherein a method of forming the alloy layer includes an E-beam.

12. The method according to claim 9, wherein the alloy layer is about 3000–6000 angstroms thick.

13. The method according to claim 9, wherein the alloy layer is made of Al/Cu alloy.

14. The method according to claim 9, wherein the step of removing the sacrificial layer is performed by supersonic vibration.

15. A method of fabricating a bonding pad structure for improving bonding pad surface quality comprising:

providing a substrate with a bonding pad located thereon and a passivation layer disposed on the bonding pad such that a portion of the bonding pad is exposed;

forming a sacrificial layer over the substrate to expose a portion of the bonding pad by forming an opening within the sacrificial layer;

forming an alloy layer on the exposed bonding pad and the sacrificial layer after forming the opening within the sacrificial layer; and removing the sacrificial layer.

16. The method according to claim 15, wherein a method of forming the alloy layer includes evaporation.

17. The method according to claim 15, wherein a method of forming the alloy layer includes E-beam.

18. The method according to claim 15, wherein the alloy layer is about 3000–6000 angstroms thick.

19. The method according to claim 15, wherein the alloy layer is made of Al/Cu alloy.

* * * * *